United States Patent [19]
Vajapey et al.

[11] Patent Number: 5,488,318
[45] Date of Patent: Jan. 30, 1996

[54] MULTIFUNCTION REGISTER

[75] Inventors: Sridhar Vajapey, Sugarland; Paul W. Krause, Sugarland; John M. Bach, Stafford, all of Tex.

[73] Assignee: Texas Instruments, Dallas, Tex.

[21] Appl. No.: 317,953

[22] Filed: Oct. 4, 1994

[51] Int. Cl.$^6$ ............................. H03K 21/00; H03K 19/20
[52] U.S. Cl. ................. 326/46; 326/105; 377/81; 377/73
[58] Field of Search ............................. 326/105–108, 326/37, 46; 340/146.2; 377/73, 81

[56] References Cited

U.S. PATENT DOCUMENTS

| | | | |
|---|---|---|---|
| 4,366,393 | 12/1982 | Kasuya | 377/73 |
| 5,015,886 | 5/1991 | Choi et al. | 326/86 |
| 5,111,488 | 5/1992 | Chaisemartin et al. | 377/81 |
| 5,281,864 | 1/1994 | Hahn et al. | 327/198 |
| 5,390,190 | 2/1995 | Nanda et al. | 326/46 |

*Primary Examiner*—Edward P. Westin
*Assistant Examiner*—Richard Raseen
*Attorney, Agent, or Firm*—C. Alan McClure; James C. Kesterson; Richard L. Donaldson

[57] ABSTRACT

A multifunction data storage register is provided having at least one first register cell having a first input multiplexer for selecting between two input signals responsive to one or more control signals and having a first output signal, a first input exclusive not OR circuit having a first input connected to said first output signal of said first input multiplexer and a second input connected to a cell output signal and having a third output signal, a first shift register latch having an input connected to said third output signal of said first input exclusive not OR circuit and having a fourth output signal, a first output exclusive not OR circuit having a first input connected to said fourth output signal of said first shift register latch and a second input connected to a feedback signal and having a fifth output signal, and a first output multiplexer for selecting between said fifth output signal and said fourth output signal responsive to said one or more control signals and having a first cell output signal, and at least one second register cell having a second input multiplexer for selecting between two input signals responsive to said one or more control signals and having a seventh output signal, a second input exclusive not OR circuit having a first input connected to said seventh output signal of said second input multiplexer and a second input connected to a cell output signal and having an eighth output signal, and a second shift register latch having an input connected to said eighth output signal of said second input exclusive not OR circuit and having a second cell output signal.

11 Claims, 7 Drawing Sheets

MULTIFUNCTION REGISTER

TECHNICAL FIELD OF THE INVENTION

The present invention relates to the field of registers, and more particularly, to multifunction registers.

BACKGROUND OF THE INVENTION

Today's microcontrollers and other processors are getting more and more complicated. However, customers using microcontrollers demand: 1) first time programming success by minimizing bugs and with better initial debug; 2) quick cycle time for program writing and debugging programs; 3) lesser PPM production line fallout (requires better debug capability); 4) increasing system integrity checks in the end applications; and 5) verification that ROM codes are correctly implemented.

Breakpoint operations are one way to accomplish these objectives, but are used only at the time of debug of the customer code. Breakpoint operations are not used in the normal operation mode of microprocessors or microcontrollers. As a result of this minimal usage, it is difficult to justify incorporating such a function (in its entirety) in devices going into volume production. However, as the demand for faster initial end product development cycle times increases and the need for debug capability required to reduce PPM fallout during production for 'unknown' causes increases, this breakpoint feature becomes essential.

An additional feature that is used to accomplish these objectives is parallel signature analysis (PSA). PSA logic typically accumulates data from a bus and compares it to previous accumulation value.

Both of these features (PSA and breakpoint) are typically implemented using two separate registers and sets of control logic. Thus, there are still unmet needs for registers capable of providing multiple functions.

SUMMARY OF THE INVENTION

According to one aspect of the present invention, a multifunction register is provided. In a presently preferred embodiment, the multifunction data storage register of the present invention consists of at least one first register cell and at least one second register cell.

Each first register cell has a first input multiplexer for selecting between two input signals responsive to one or more control signals and having a first output signal, a first input logic circuit having a first input connected to said first output signal of said first input multiplexer and a second input connected to a cell output signal and having a third output signal, a first shift register latch having an input connected to said third output signal of said first input logic circuit and having a fourth output signal, a first output logic circuit having a first input connected to said fourth output signal of said first shift register latch and a second input connected to a feedback signal and having a fifth output signal, and a first output multiplexer for selecting between said fifth output signal and said fourth output signal responsive to said one or more control signals and having a first cell output signal.

Each second register cell has a second input multiplexer for selecting between two input signals responsive to said one or more control signals and having a seventh output signal, a second input logic circuit having a first input connected to said seventh output signal of said second input multiplexer and a second input connected to a cell output signal and having an eighth output signal, and a second shift register latch having an input connected to said eighth output signal of said second input logic circuit and having a second cell output signal.

Preferably, the number of the first register cells is three and the number of the second register cells is thirteen to provide a sixteen bit multifunction register capable of either parallel signature analysis or breakpoint analysis.

The present invention provides a register apparatus for performing parallel signature analysis and breakpoint analysis.

The present invention also provides a system for low cost test and emulation capability on a microcontroller or other processor.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

The present invention provides multifunction registers. However, before discussing the multifunction register of the present invention a brief discussion of the registers of FIGS. 1 and 2, which are only capable of performing single functions, follows to provide a basis for understanding the present invention, as depicted in the remaining Figures.

Figure 1:
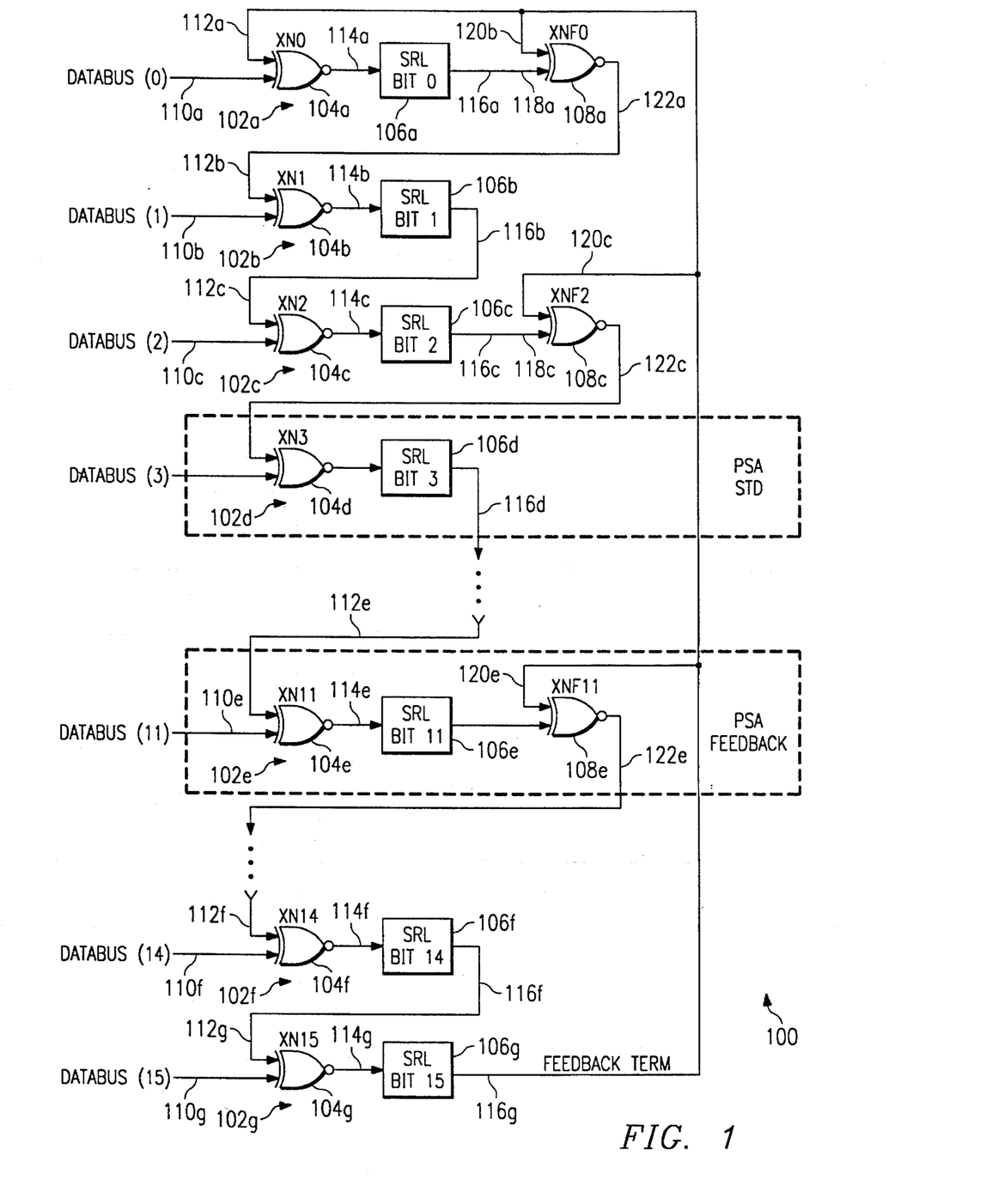
FIG. 1 depicts a functional block diagram of a single function register for performing parallel signature analysis.

Referring now to FIG. 1 there may be seen a functional block diagram of a single function register for performing parallel signature analysis. FIG. 1 depicts a sixteen bit register 100, with selected register bit positions corresponding to register cells 102a–102g. However, for ease of illustration purposes several of the bit positions or register cells 102 have been omitted and their omission indicated with a dashed or dotted line. Each of the register cells 102 includes a shift register latch (SRL) circuit 106 and an input exclusive not OR circuit 104. Certain of the register cells 102a, 102c, 102e also include an output exclusive not OR circuit 108 to allow for intra-cell feedback.

As may be seen from FIG. 1, a first register cell 102a corresponds to bit position zero. An input exclusive not OR (hereinafter "XNOR") 104a has two inputs 110a and 112a. Input 110a supplies the zeroth data bit from a data bus, which may represent data read by a central processing unit (CPU) from a memory associated therewith. Input 112a supplies the data bit from the previous register cell, which for the zeroth cell 102a of FIG. 1 is the last register cell 102g that corresponds to the 15th bit of the sixteen bit register 100.

The output of XNOR 104a is supplied as the input to a shift register latch (SRL) 106a. Output 116a of latch 106a is supplied as one input 118a to output XNOR 108a. The other input 120a of XNOR 108a is a feedback signal, which in FIG. 1 is supplied by the last register cell 102g (corresponding to bit position 15). Output 122a of XNOR 108a is supplied as one input 112b of an input XNOR 104b of the following or next register cell 102b.

Input XNOR 104b is part of register cell 102b, which is the bit one or first bit position of the register 100. The other input 110b is the first data bit (bit 1) from a data bus, which again may represent data read by a central processing unit (CPU) from a memory associated therewith. Output 114b of XNOR 104b is supplied as the input to shift register latch 106b. Output 116b of latch 106b is supplied as an input to one input 112c of XNOR 104c of the next register stage 102c. The remaining register cells are similarly connected with bits 4–10 and 12–13 being "standard" register cells, as described more fully later herein.

As noted earlier there are two basic types of register cells shown in FIG. 1, a "standard" register bit cell 102b containing an input exclusive not OR circuit 104 and a shift register latch 106, and a "feedback" register bit cell 102a containing these items and an output exclusive not OR circuit 108.

As shown in FIG. 1, for a standard register cell 102b, the data from the previous register cell (or bit position) 102a is XNORed with the data bus bit 110b corresponding to that cell 102b and the result is stored as the current bit in the shift register latch 106b. This is, for each ith standard cell, the bit stored in the ith shift register latch of that ith cell is the result of an exclusive not OR (XNOR) comparison of the ith data bus bit and the bit stored in the (i–1)th shift register latch. XNOR gates 104a–104g are used to perform the compare function.

As also shown in FIG. 1, for a feedback register cell, the standard cell output is XNORed with a feedback bit, which corresponds to cell 102g or bit position 15 of FIG. 1. This is, for each feedback register cell, the bit stored in the ith shift register latch is exclusive not OR'd (XNOR'd) with the feedback bit and the results of that comparison provided as an input to the (i+1)th cell's input XNOR gate.

Parallel signature analysis (PSA) may be used to check the integrity of any data in a memory. One example of such use would be to accumulate, by adding together or comparing, the data values in a random access memory (RAM). To accomplish this the PSA register is initially cleared (all bits set to zero). Then every word of the RAM is sequentially read by the CPU and added to, or compared to, the previous value in the register. The resulting accumulated value in the PSA register can then be read and stored in a designated non-volatile memory location or register. The PSA register may be designed to accumulate a RAM only, an EEPROM only, a ROM only, an EPROM only, selective combinations thereof, or any other data storage location.

Thus, the parallel signature analysis logic may be used to accumulate data on an address bus or a data bus (or any bus of interest). The equation it accumulates by is typically hardcoded by the hardware configuration used in the register.

There are many ways a PSA register can be made to work. In one implementation the PSA register was designed to accumulate data based upon a hardcoded equation on every valid memory bus access made by the CPU. The hardwired equation used was:

$$X^{16}+X^{12}+X^3+X+1.$$

For this specific exemplary implementation of the circuitry of FIG. 1, 450 transistors were required.

Figure 2:
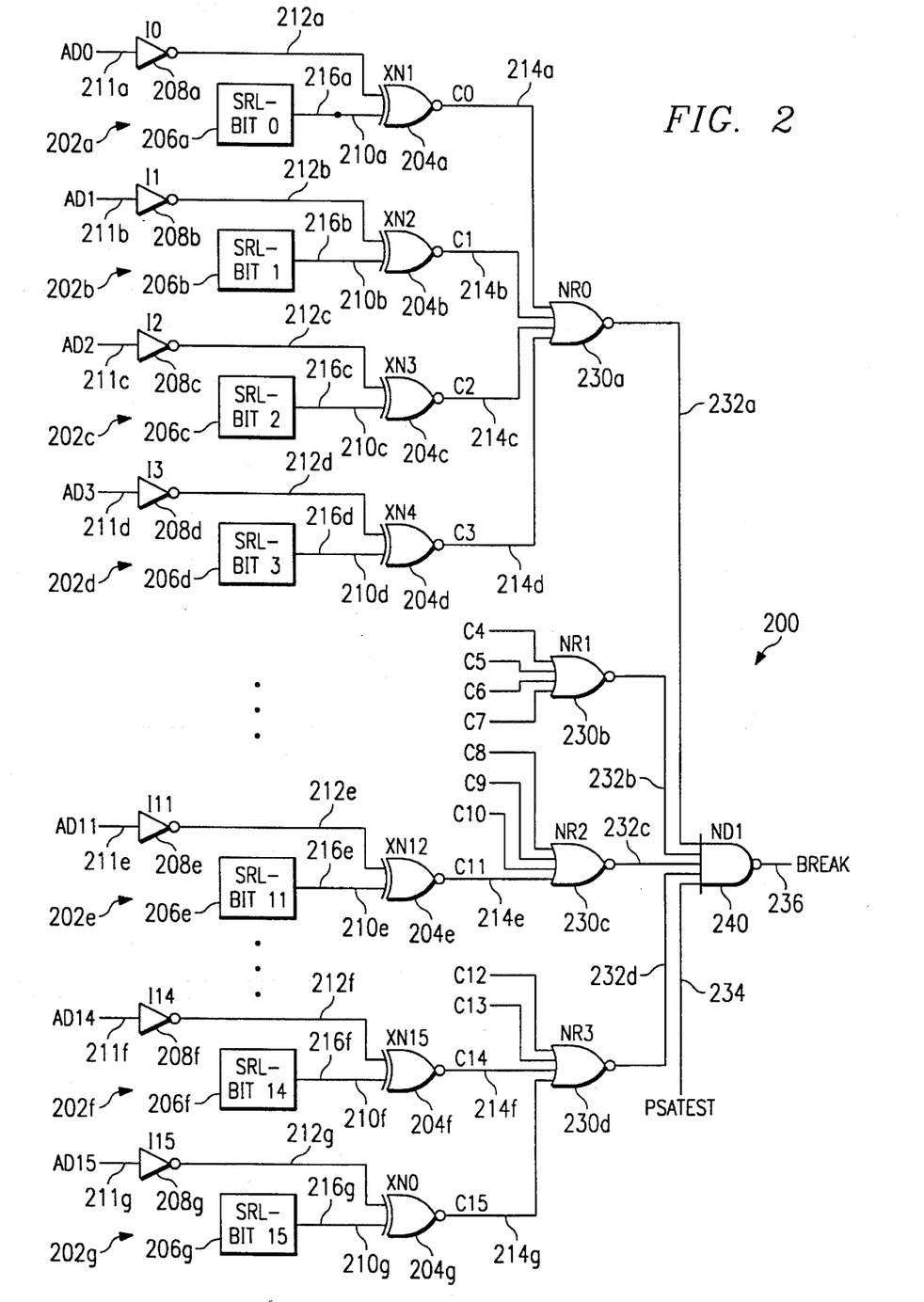
FIG. 2 depicts a functional block diagram of a single function register for performing breakpoint analysis.

Referring now to FIG. 2 there may be seen a functional block diagram of a single function register 200 for performing breakpoint analysis. FIG. 2 depicts a sixteen bit register 200, with selected register bit positions corresponding to register cells 202a–202g. However, for ease of illustration purposes several of the bit positions or register cells 202 have been omitted and their omission indicated with a dashed or dotted line. Each of the register cells 202 includes a shift register latch (SRL) circuit 206, an output exclusive not OR circuit 204, and an input inverter 208.

As may be seen from FIG. 2, a first register cell 202a corresponds to bit position zero, a second register cell 202b corresponds to bit position one and so forth for the correspondence between the remaining register cells and bit positions. The output exclusive not OR (hereinafter "XNOR) 204a has two inputs 210a and 212a. Input 210a supplies the stored zeroth data bit for an address bus, which represents the stored address for which the central processing unit (CPU) is to be halted. This stored address is typically loaded into the shift register latch (SRL) 206a by the CPU using an input line not depicted in FIG. 2. Similarly, the other fifteen bits of the sixteen bit address are loaded into the shift register latches of the other register cells 202a–202g. The output 216a of SRL 206a is supplied to input 210a.

Input 212a supplies the zeroth data bit from the address bus with which the stored address bit value is to be compared. From FIG. 2, it may be seen that the zero bit output from the address bus 211a is first inverted by inverter 208a before being supplied as an input to one input 212a of XNOR 204a. In a similar manner, register cells 202b, 202c and 202d are connected to address but bit positions one, two and three, respectively, and compare the address bus bit with the bit stored in their SRL 206.

The four individual outputs 214a–214d from the output XNORs 204a–204d are supplied as inputs to a not OR (NOR) circuit 230a where they are logically consolidated in a single output 232a. The remaining register cells are associated in groups of four and their outputs similarly provided to NOR circuits 230b–230d. The outputs 232a–232d of NOR circuits 230a–230d are provided as inputs to a not AND (NAND) circuit 240, where along with a test or control signal 234 they are logically consolidated in a single output 236. This single output 236 is provided to the CPU and serves to halt the CPU upon output of a preselected signal from NAND gate 240. In one exemplary implementation of the circuitry of FIG. 2, 430 transistors were required.

A breakpoint register is one that stops the CPU when it hits a certain location in the program code. This is done by comparing the address on the memory (or program) bus with an address value stored in a register and when the two addresses are the same a signal is generated that stops the CPU.

In FIG. 2, the shift register latches 206a–206g may form a memory mapped or addressable breakpoint register which can be loaded with the desired breakpoint address. XNOR gates 204a–204g perform the comparison between the breakpoint address and the actual address on the bus. NOR gates 230a–230d and NAND gate 240 basically "AND" all the bit compares from the individual XNOR gates to assert a breakpoint signal to the CPU.

As shown in FIG. 2, the bit compare operation is accomplished by XNORing the ith SRL bit value with the ith bus address bit. When all the address bus bits are the same as the respective stored bits (i.e. C(15-0) are asserted LOW) and a test or control signal is asserted (high) then a breakpoint is asserted and the CPU is halted. This allows the emulator or simulator to determine if the proper operations and results are occurring and if not, provide data for correcting the code to provide the desired operations.

Breakpoint circuitry is not used in the normal functional operational mode of a microprocessor or microcontroller. It is conventionally used only at the time of debug of application code designed and written to run on the microprocessor or microcontroller.

Figure 3A:
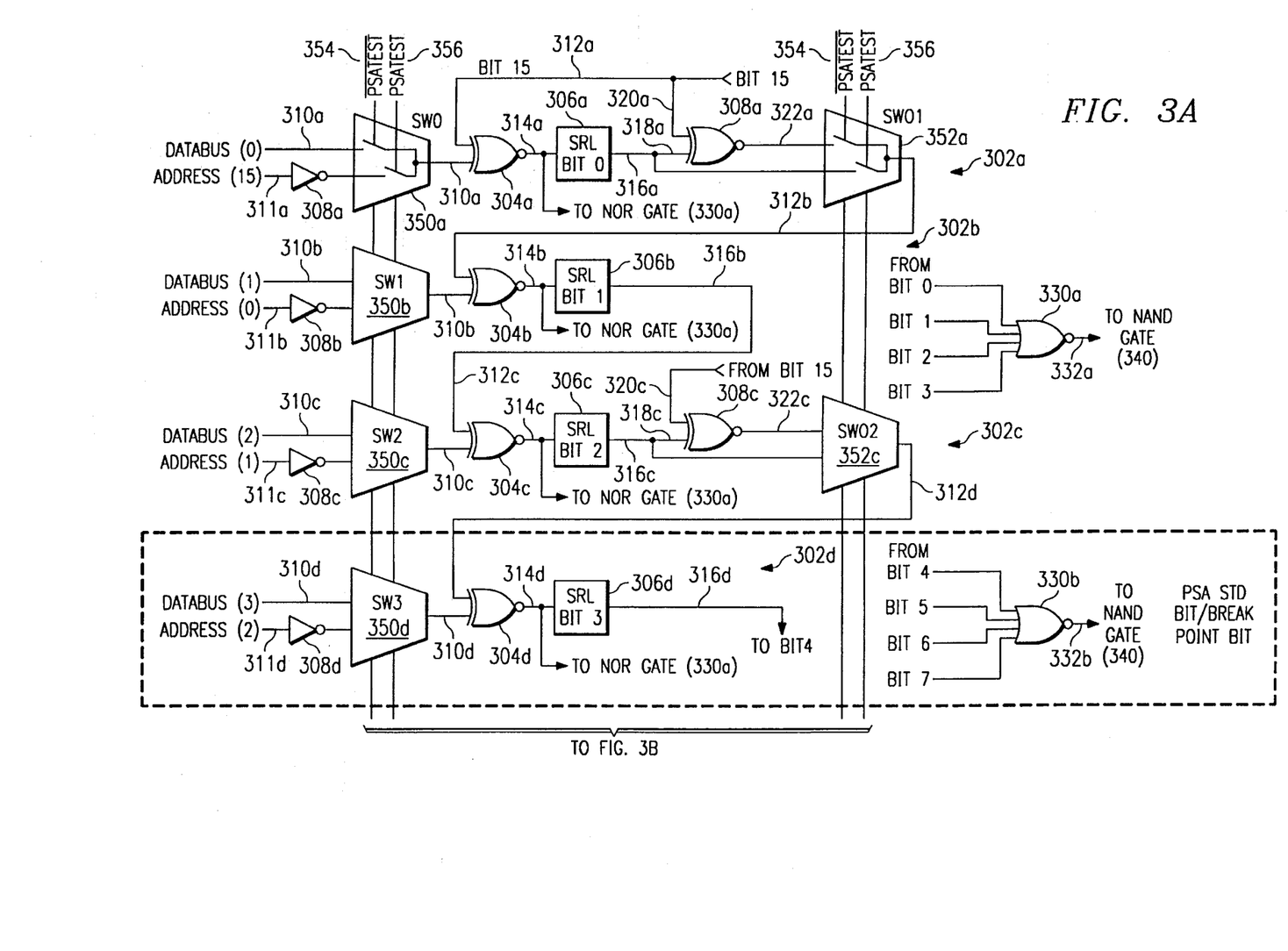
FIG. 3 depicts a functional block diagram of a multifunction register of the present invention for performing parallel signature analysis or breakpoint analysis.
Figure 3B:
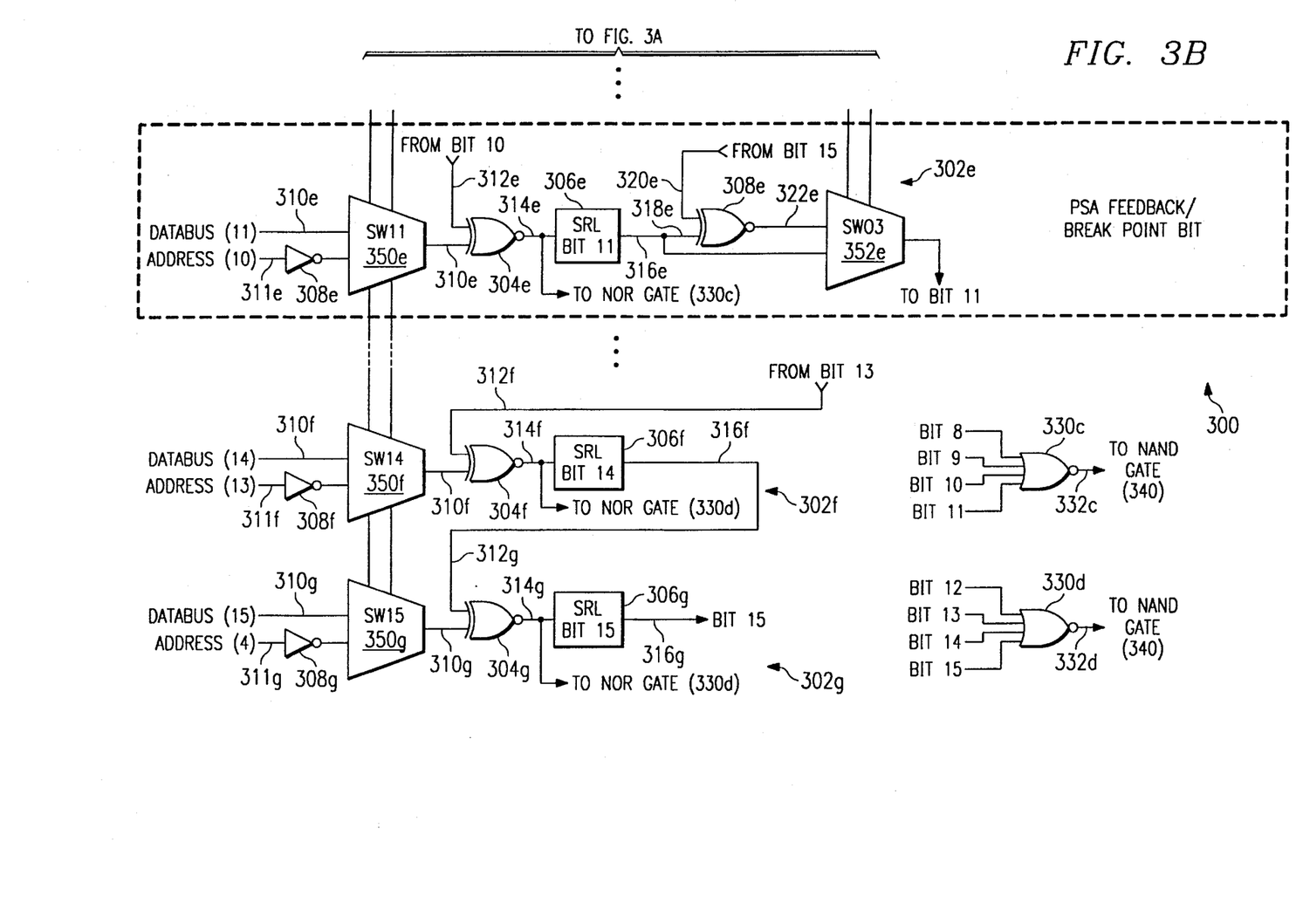

Referring now to FIG. 3 there may be seen a functional block diagram of a presently preferred embodiment of a multifunction register of the present invention for performing parallel signature analysis or breakpoint analysis. FIG. 3 depicts a sixteen bit register 300, with selected register bit positions corresponding to register cells 302a–302g. Clearly, any number of bit positions may be so employed in a register of the present invention.

For ease of illustration purposes several of the bit positions or register cells 302 have been omitted and their omission indicated with a dashed or dotted line. Note that bit positions 4–10 and 12–13 are "standard" register cells, as described more fully later herein. Each of the register cells 302 includes a shift register latch (SRL) circuit 306, an input logic circuit 304, and an input multiplexer 350. Certain of the register cells 302a, 302c, 302e also include an output logic circuit 308 to allow for intra-cell feedback and an output multiplexer 352.

As may be seen from FIG. 3, a first register cell 302a corresponds to bit position zero. An input logic circuit 304a, which is preferably an exclusive not OR (hereinafter "XNOR") has two inputs 310a and 312a; other types of logic gates or logic circuits may be employed as the input logic circuit 304. Input 310a supplies the zeroth data bit from a data bus, which may represent data read by a central processing unit (CPU) from a memory associated therewith, or an inverted address bit for bit 15, depending upon the output from input multiplexer 350a. Control signal(s) 354, 356, which are applied to multiplexer 350a determine which one of its two inputs will be selected as the multiplexer output. Input 312a supplies the data bit from the previous register cell, which for the zeroth cell 302a of FIG. 3 is the last register cell 302g, that corresponds to the 15th bit.

The output of the input logic circuit or XNOR 304a is supplied as the input to the shift register latch (SRL) 306a and as an input to a summing logic circuit 330a, which is preferably a NOR gate. Other types of logic gates or logic circuits may be employed as the summing logic circuit 330. Logic circuits 330a–330d supply inputs to a final logic circuit 340, which is preferably a NAND gate (not depicted in FIG. 3, but similar in function to NAND gate 240 of FIG. 2). Other types of logic gates or logic circuits may be employed as the logic circuit 340.

Shift register latch 306a is a conventional scanable latch, described in more detail later herein. The output 316a of latch 306a is supplied as one input 318a to output logic circuit 308a, which is preferably an XNOR circuit, and as one input to output multiplexer 352a. Other types of logic gates or logic circuits may be employed as the output logic circuit 308. The other input 320a of output logic circuit 308a is a feedback signal, which in FIG. 3 is supplied by the last register cell 302g, corresponding to bit position 15. The output 322a of output logic circuit 308a is supplied as one input to multiplexer 352a. Depending upon the control signal(s) 354, 356 applied to multiplexer 352a one of its two inputs will be selected as the multiplexer output. The multiplexer output in turn is supplied as one input 312b of the input logic circuit 304b of the following or next register cell 302b.

The input logic circuit 304b, which is preferably an XNOR circuit, is part of register cell 302b, which is the bit one or first bit position of the register 300. The other input 310b of the input logic circuit 304b is the first data bit (bit 1) from a data bus 310b, or an inverted address bit for bit zero, depending upon the output from input multiplexer 350b. Control signal(s) 354, 356, which are applied to multiplexer 350b determine which one of its two inputs will be selected as the multiplexer output.

The output 314b of input logic circuit 304b is supplied as the input to shift register latch 306b and as an input to summing logic circuit 330a. Shift register latch 306b is a conventional scanable latch. The output 316b of SRL 306b is supplied as an input to one input 312c of input logic circuit 304c of the next register stage 302c. The remaining register cells are similarly connected.

The input multiplexers 350a–350g and output multiplexers 352a–352g are preferably controlled by the same control signal (or set of control signals) 354, 356. However, other control schemes and control signals may be so employed in other embodiments of the present invention. For one mode of operation, the ith data bus information is supplied to the ith input logic circuits 304 and the output of the ith output logic circuits 308 are supplied as inputs to the subsequent (i+1)th stage's input logic circuit 304. For the other mode of operation, the ith address bus bit is compared to the ith bit stored in the (i–1)th shift register latch 306 and the output of the (i+1)th input multiplexer 304 supplied to summing logic gates 330.

As noted earlier there are two basic types of register cells shown in FIG. 3. First, a "standard" register bit cell 302b containing an input multiplexer 350, an input logic circuit 304, which is preferably an exclusive not OR circuit, and a shift register latch (SRL) 306, and second, a "feedback" register bit cell 302 containing these items and an output logic circuit 308, which is preferably an exclusive not OR circuit, and an output multiplexer 352. Any type of logic gates or logic circuits may be employed as the input logic circuit 304 or output logic circuit 308 that perform the required functions.

As shown in FIG. 3, for a preferred "standard" register cell 302b, the data from the previous register cell (or bit position) 302a is XNORed with the data bus bit 310b corresponding to that cell 302b or the address bus bit from the previous cell 302g, depending upon the control signals 354, 356 sent to input multiplexer 350a, and the result is stored as the current bit in the shift register latch 306b. That is, for each ith standard cell, the bit stored in the ith shift register latch of that ith cell is the result of an exclusive not OR (XNOR) comparison of the ith data bus bit or the (i–1)th address bus bit and the bit stored in the (i–1)th shift register latch. XNOR gates 304a–304g are used to perform the compare function.

As also shown in FIG. 3, for a preferred "feedback" register cell, the standard cell output is XNORed with a feedback bit, which corresponds to cell 302g or bit position 15 of FIG. 3. That is, for each feedback register cell, the bit stored in the ith shift register latch is exclusive not OR'd (XNOR'd) with the feedback bit and the results of that comparison provided as an input to the (i+1)th cell's input XNOR gate, via the output multiplexer. Alternatively, the output multiplexer may output the SRL bit as the input the (i+1)th cell's input XNOR.

By combining the functionality of the register in FIG. 1 with the functionality of the register in FIG. 2 in a multifunction register, a considerable savings in transistor count is accomplished. In one exemplary implementation of the circuitry of FIG. 3, 696 transistors were required, which results in a savings of 184 transistors compared to the sum of 880 transistors for the separate registers of FIGS. 1 and 2. This is approximately a 20% savings in transistor count resulting from the use of the multifunction register of the present invention.

Thus, the multifunction register of the present invention provides cost savings by implementing both PSA and Breakpoint functions in one logic design, resulting in a 20% reduction in the number of transistors over separate logic implementations.

PSA/breakpoint registers larger than sixteen bits may be employed and still be within the scope of the present invention. Further, byte and/or word capability may also be added to the PSA register; where a byte is the upper or lower eight bits of the sixteen bits and a word is the full sixteen bits.

To keep it simple, PSA may be designed to accumulate on any valid memory bus cycle. Examples of when PSA logic is useful are:

1) checking the integrity of a RAM coming out of a STANDBY or HALT mode in a microcontroller. That is, before entering into the STANDBY or HALT mode a PSA accumulation is done and the value is stored. Coming out of the STANDBY or HALT mode the CPU can re-accumulate the RAM and compare the result with the original stored value. Discrepancy between the two values indicates corruption of the RAM's data.

2) Checking of a ROM to ensure that the ROM code sent by a customer for programming of the ROM is the same as that manufactured. The customer can generate the accumulated value by simulation or by using a emulation tool and then code it as a part of the ROM. After the ROM, or device with ROM, is manufactured, the application could re-accumulate the ROM on every reset or initial power-up or reboot to verify ROM integrity.

Again, a breakpoint operation is not used in the normal operation mode of microprocessors or microcontrollers. It is normally used only at the time of debug of the application code. However, breakpoints may also be used with test scans to give the ability to track down errors in program or hardware while the device is still undergoing development and/or final testing.

As a result of this minimal usage, it is difficult to justify the cost or chip area for incorporating such a function (in its entirety) in devices going into volume production and still remaining cost competitive. However, as the demand for shorter product development cycle times increases and the demand for additional debug capabilities to reduce PPM fallout during production for "unknown" causes increases, such a breakpoint feature becomes essential. The multifunction register of the present invention provides a way to accomplish these conflicting demands. That is, the present invention combines a test feature (PSA) and an emulation feature (breakpoint) in one place that reduces the overhead for infrequently used functions.

Figure 4:
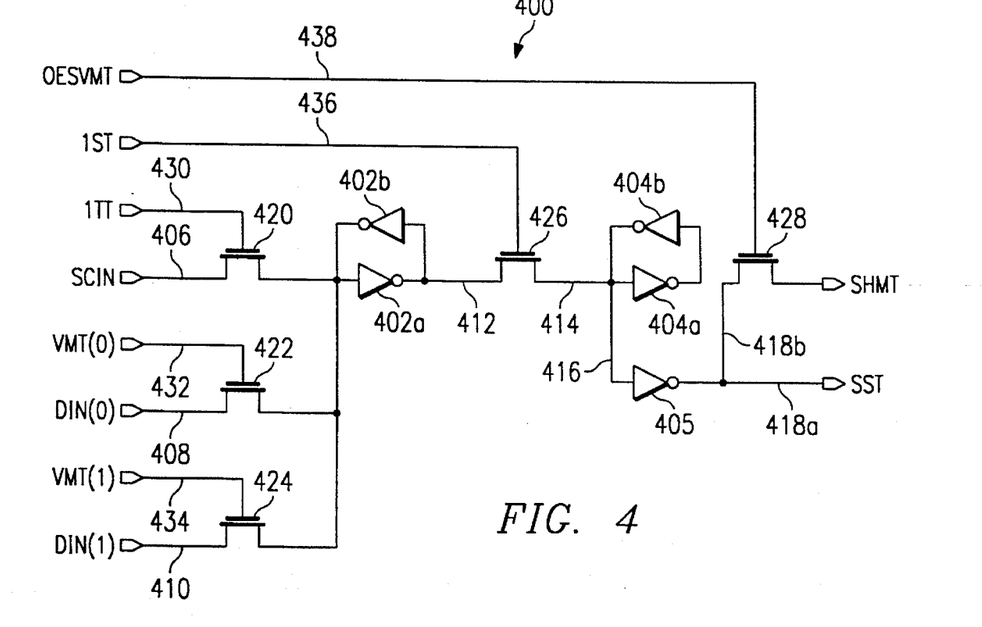
FIG. 4 depicts a functional block diagram of a shift register latch used in FIG. 3.

Referring now to FIG. 4 there may be seen a functional block diagram of an exemplary shift register latch (SRL) 400 used in FIG. 3. As can be seen from FIG. 4, the SRL 400 consists of two sets of inverters 402, 404. Inverter pair 402a, 402b serves as the input or master latch, while inverter pair 404a, 404b serves as the output or slave latch.

The inverter pairs are typical inverters with the "a" inverter being the "stronger" of the two inverters in a pair. The input inverter 402 has three possible gated inputs 406, 408, 410 that are individually gated by FETs 420, 422, 424, respectively. The signal lines for controlling FETs 420, 422, 424 are 430, 432, 434, respectively.

The output 412 from input inverter pair 402 is supplied to the input 414 of the output inverter pair 404 via FET 426 and control signal 436. The input 414 of output inverter pair 404 is also supplied to the input 416 of inverter 405. Inverter 405 is employed to provide the output of the latch 400 rather than the slave latch pair 404; this isolates any voltage fluctuations on the output line from changing the state latched into latch pair 404. Inverter 405 has two outputs 418a and 418b. Output 418a is a direct output for the latch 400 while output 418b is gated by FET 428, which in turn is controlled by signal 438.

Briefly, the operation of latch 400 is as follows. Output 418a corresponds to lines 316 of FIG. 3 and is the normal output of the latch 400. Output 418b is gated by FET 428, which is controlled by signal "oesvmt" on line 438, to provide an output to a data bus. Signal "lst" on line 436 is the slave clock signal for shifting the data from the master latch 402 to the slave latch 404. Signal "ltt" on line 430 is the master clock signal for gating data into the master latch 402 via line 406; that is, line 406 is used to load "scan in" data into the latch 400. Signal "vmt[0]" is the control signal for a PSA accumulate operation and enables PSA data on line 408, "din[0], to be loaded into latch 400, via FET 422. Signal "vmt[1]" is the control signal for a data bus access and enables data from a data bus, "din[1]", to be loaded into latch 400. Clearly, other arrangements of inputs and control signals may be employed in other embodiments of the present invention. Some of the logic used to generate these control signals is discussed more fully later herein with reference to other figures.

Figure 5:
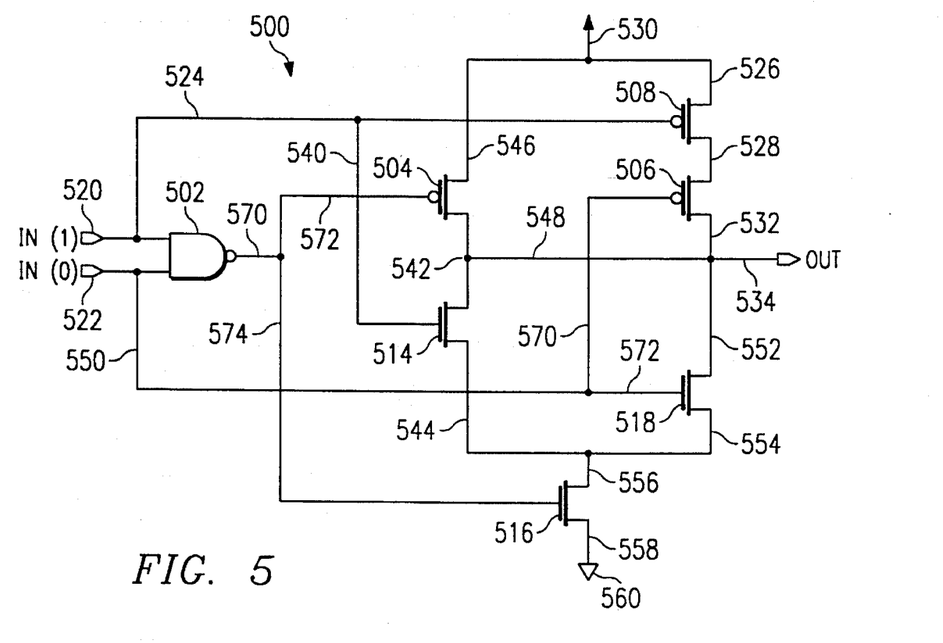
FIG. 5 depicts a functional block diagram of an exclusive not OR circuit used in FIG. 3.

Referring now to FIG. 5 there may by seen a functional block diagram of an exemplary exclusive not or (XNOR) circuit 500 preferably used as the input and output logic circuits in FIG. 3. However, as noted earlier herein, any type of logic gates or logic circuits may be employed as the input logic circuit 304 or output logic circuit 308 that perform the required functions; for example, but not limited to this example, breakpoint logic may employ AND gates. As can be seen from FIG. 5, the XNOR circuit 500 is comprised of a NAND gate 502, three p-channel FETs 504, 506 508 and three n-channel FETs 514, 516, 518. Further, other types of logic gates or logic circuits and arrangements may be employed, instead of the gates and arrangements depicted in FIG. 5, to perform the required XNOR functions.

The functionality of an XNOR gate is shown in following truth table:

| Input1 | Input2 | XNOR Output |
|--------|--------|-------------|
| 0 | 0 | 1 |
| 0 | 1 | 0 |
| 1 | 0 | 0 |
| 1 | 1 | 1 |

NAND gate 502 has two inputs 520 and 522. NAND gate 502 is a typical NAND gate and employs conventional circuitry. Input 520 is connected to line 524 which is connected to the gate of p-channel FET 508. The first source/drain of FET 508 is connected to line 526 and the second source/drain is connected to one end of line 528. The other end of line 528 is connected to the first source/drain of FET 506. Line 526 is connected at one end to line 530, which is connected to a voltage source appropriate for use with the FETs.

The second source/drain of FET 506 is connected to line 532 which is in turn connected to line 534, which is the output line for XNOR 500.

Line 524 is also connected to line 540. Line 540 is connected to the gate of FET 514. The first source/drain of FET 514 is connected to line 542 and the second source/drain of FET 514 is connected to line 544. Line 542 is connected to the second source/drain of FET 504 and to line 548. Line 548 is connected to line 534 or the output of XNOR 500. Line 544 is connected to line 554 and line 556. The first source/drain of FET 504 is connected to line 546, which is in turn connected to line 530 or the power supply.

Input 522 is connected to line 550. Line 550 splits into two lines, line 570 and line 572. Line 572 is connected to the gate of FET 518. FET 518 has a first source/drain connected to line 552. Line 552 is in turn connected to output line 534. The second source/drain of FET 518 is connected to line 554, which is connected to line 544 and line 556. Line 556 in turn is connected to the first source/drain of FET 516. The second source/drain of FET 516 is connected to line 558, which is connected to ground 560.

The output 570 of NAND gate 502 splits into line 572 and line 574. Line 572 is connected to the gate of FET 504. Line 574 is connected to the gate of FET 516.

The details of the operation of the circuitry of FIG. 5 will not be discussed, as its understanding is not necessary to understand the present invention.

Figure 6:
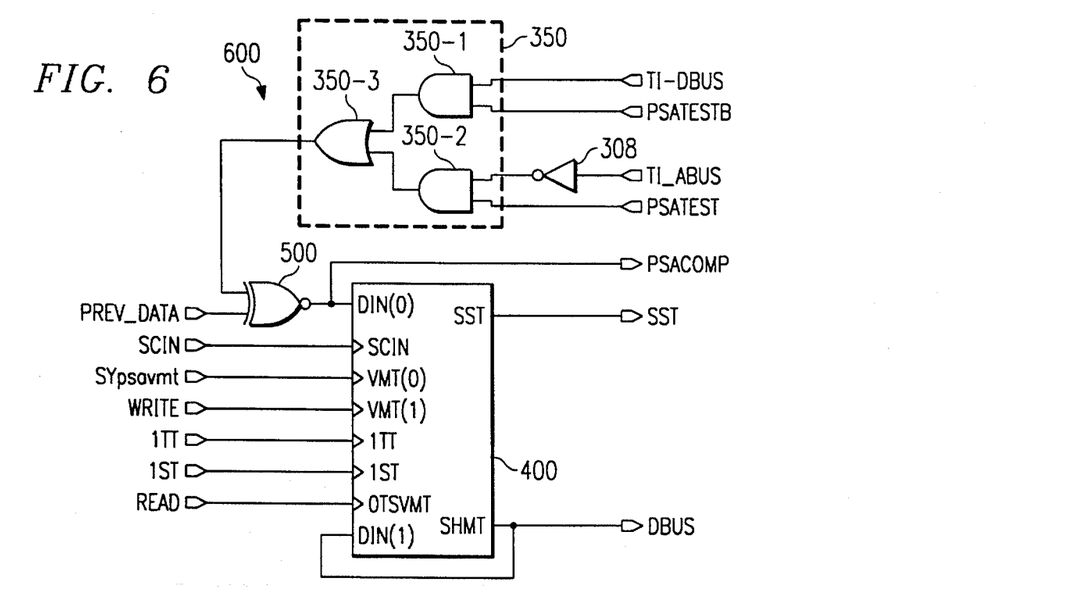
FIG. 6 depicts a functional block diagram of a first register cell used in FIG. 3.

Referring now to FIG. 6 there may be seen a functional block diagram of a first exemplary register cell 600 used in FIG. 3. FIG. 6 depicts a preferred embodiment of the "standard" register cell 600. A "standard" register cell 600, such cell 302b of FIG. 3, contains an input multiplexer 350b, an input logic circuit 304b, which is preferably the exclusive not OR circuit 500 of FIG. 5, and a shift register latch (SRL) 306b, which is preferably the latch 400 depicted in FIG. 4. Any type of logic gates or logic circuits may be employed as the input logic circuit 304 that perform the required functions.

As shown in FIG. 6, for a preferred "standard" register cell 600, the data from the previous register cell (or bit position), "prev_data", is XNORed with the data bus bit, "ti_dbus", corresponding to that cell or the address bus bit, "ti_abus", from the previous cell, depending upon the output of input multiplexer 350b, and the result is stored as the current bit in the shift register latch 400. The outputs from latch 400 are the normal cell output, "sst", and the data bus output, "dbus".

As may be seen from FIG. 6, input multiplexer 350 consists of two AND gates 350-1, 350-2, each of whose outputs are inputs to a NOR gate 350-3. Any type of logic gates or logic circuits and different arrangements thereof may be employed as the multiplexer. Control signal(s) 354, 356, of FIG. 3 are depicted in FIG. 6 as signals "psatestb" and "psatsest", respectively. However, "psatestb" is the inverse of "psatest" (or "psatest" bar in FIG. 3), so that one control signal may be used with multiplexer 350a to determine which one of its two inputs will be selected as the multiplexer output.

That is, for each ith standard cell, the bit stored in the ith shift register latch of that ith cell is the result of an exclusive not OR (XNOR) comparison of the ith data bus bit or the (i−1)th address bus bit and the bit stored in the (i−1)th shift register latch.

Figure 7:
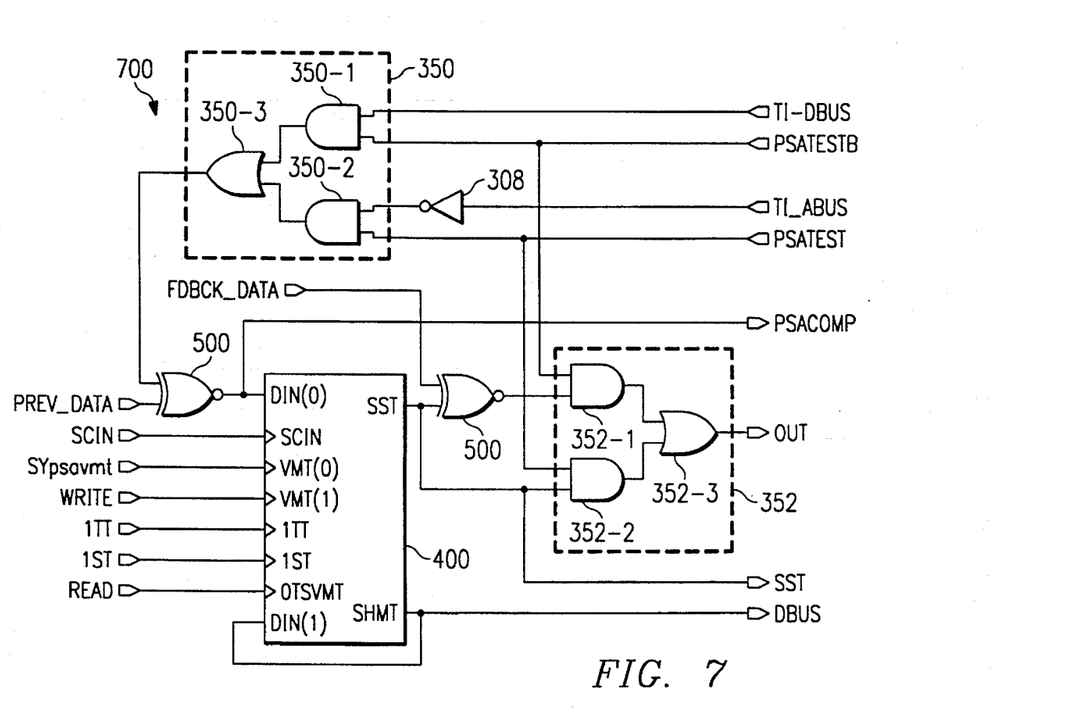
FIG. 7 depicts a functional block diagram of a second register cell used in FIG. 3.

Referring now to FIG. 7 there may be seen a functional block diagram of a second exemplary register cell 700 used in FIG. 3. FIG. 6 depicts a preferred embodiment of the "feedback" register cell 700. A "feedback" register bit cell 700, such as cell 302 depicted in FIG. 3, contains the items of the "standard" cell of FIG. 6 and also contains an output logic circuit 308a, which is preferably the exclusive not OR circuit 500 of FIG. 5, and an output multiplexer 352. Any type of logic gates or logic circuits may be employed as the input logic circuit 304 or output logic circuit 308 that perform the required functions.

As may be seen from FIG. 7, input multiplexer 350 consists of two AND gates 350-1, 350-2, each of whose outputs are inputs to a NOR gate 350-3. Similarly, output multiplexer 352 consists of two AND gates 352-1, 352-2, each of whose outputs are inputs to a NOR gate 352-3. Any type of logic gates or logic circuits and different arrangements thereof may be employed as the multiplexer. Control signal(s) 354, 356, of FIG. 3 are depicted in FIG. 7 as signals "psatestb" and "psatsest", respectively. However, "psatestb" is the inverse of "psatest" (or "psatest" bar in FIG. 3), so that one control signal may be used with multiplexer 350a to determine which one of its two inputs will be selected as the multiplexer output.

As also shown in FIG. 7, for a preferred "feedback" register cell 700, the standard cell output is XNORed with a feedback bit, "fdbck_data", which corresponds to the output from a feedback cell. That is, for each feedback register cell 700, the bit stored in the ith shift register latch is exclusive not OR'd (XNOR'd) with the feedback bit and the results of that comparison provided as an input to the (i+1)th cell's input XNOR gate, via the output multiplexer. Alternatively, the output multiplexer may output the SRL bit as the input the (i+1)th cell's input XNOR.

Figure 8:
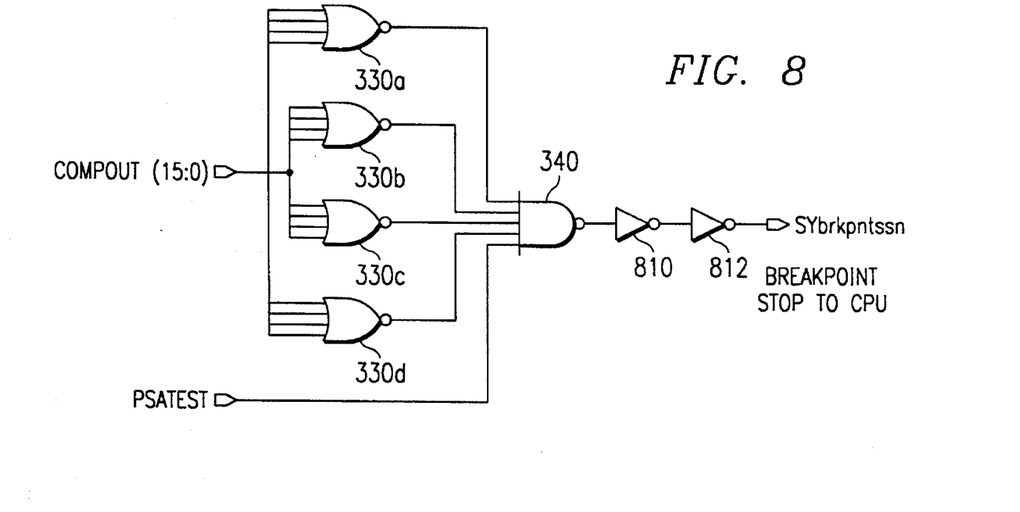
FIG. 8 depicts a functional block diagram of logic associated with the multifunction register of FIG. 3 for performing breakpoint analysis.

Referring now to FIG. 8 there may be seen a functional block diagram of exemplary logic associated with the multifunctional register of FIG. 3 for performing breakpoint analysis. FIG. 8 illustrates how the output signals from each of the input logic circuits is input into one of a set of four summing logic circuits, or NOR gates, 330a–330d. The individual inputs are shown as coming from a bus denoted "compout [15:0]". The outputs of the summing circuits are provided as inputs to final logic circuit 340. A control signal, "psatest", is an additional input to circuit 340. The output of circuit 340 is buffered by two serial output inverters 810, 812, and is the signal for halting the CPU.

Figure 9:
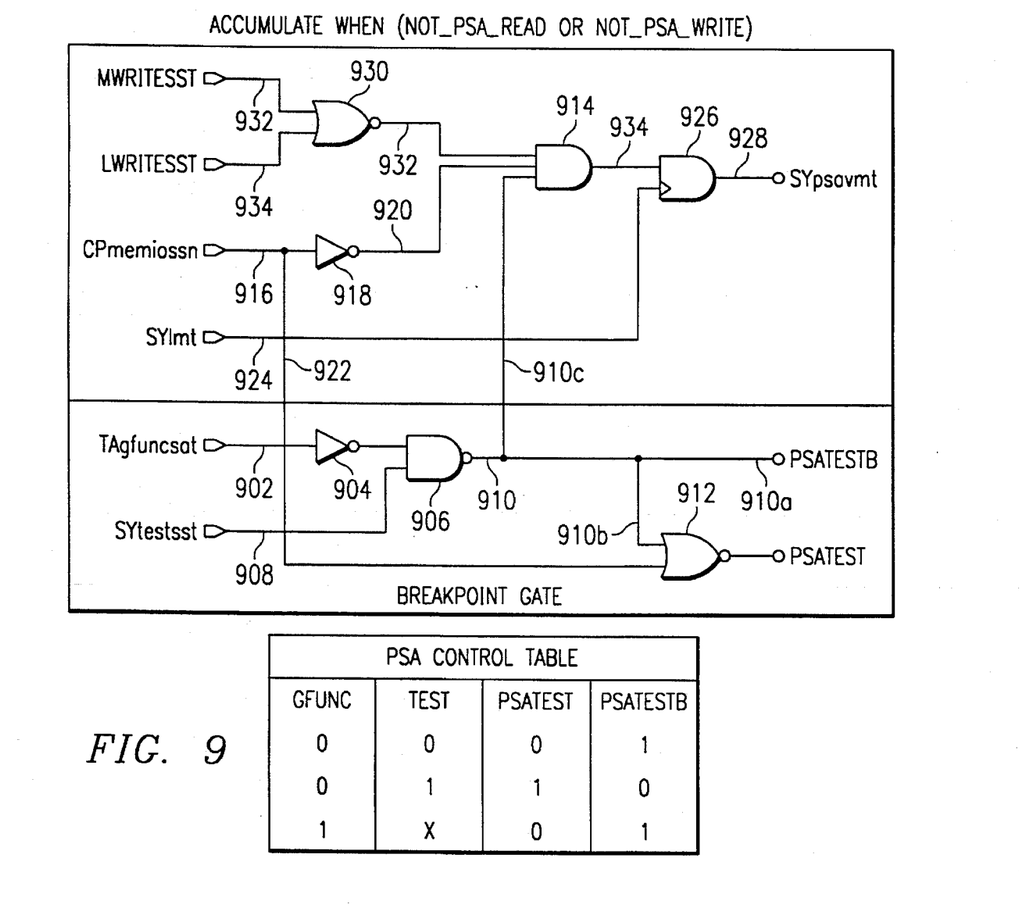
FIG. 9 depicts a functional block diagram of logic associated with the multifunction register of FIG. 3 for selecting between parallel signature analysis and breakpoint analysis.

Referring now to FIG. 9 there may be seen a functional block diagram of exemplary and preferred logic associated with the multifunctional register of FIG. 3 for selecting between parallel signature analysis and breakpoint analysis. Any type of logic gates or logic circuits and different arrangements thereof may be employed to perform the functions of this circuitry, as noted by the truth table in FIG. 9.

As may be seen from FIG. 9, line 902 provides signal "TAgfuncsat" to inverter 904 which supplies the invereted signal to NAND gate 906. The other input to NAND gate 906 is supplied by line 908 and is "SYtestsst". In the truth table "TAgfuncsat" is represented by heading "gfunc" and "SYtestst" is represented by "test". Signals "psatestb" and "psatsest" are depicted in FIG. 9 but are control signal(s) 354, 356, of FIG. 3, respectively; however, "psatestb" is the inverse of "psatest" (or "psatest" bar in FIG. 3).

The output 910 of NAND gate 906 is split into three lines 910a–910c and provided to several different areas. Output line 910a provides a final output signal, "psatestb", which as noted earlier herein is the inverse or bar of "psatest". Output line 910b provides an input to NOR gate 912, while output 910c provides an input to AND gate 914.

Signal "CPmemiossn" is provided on line 916 to inverter 918 and the inverted signal is provided, via line 920, as an input to AND gate 914. This same signal is provided, via line 922, as an input to NOR gate 912. The signal "CPmemiossn" is a signal indicating that the CPU is performing a valid data access to the data bus, which may be a read or write, but is preferably a read.

Line 924 provides signal "SYlmt" to AND gate 926; this signal is the master clock signal. The output 928 of AND gate 926 is a signal "SYpsavmt" which turns on the PSA accumulate function.

Two signals "mwritesst" and "lwritesst" are provided as inputs to NOR gate 930, via lines 932 and 934, repectively; these signals correspond to most significant bit write and least significant bit write, respectively. The output of NOR gate 930 is provided as an input to AND gate 914, via line 932. The output of AND gate 914 is provided as an input to AND gate 926, via line 934. Again, any type of logic gates or logic circuits and different arrangements thereof may be employed to perform the functions of this circuitry, as noted by the truth table in FIG. 9.

The present invention is capable of being implemented in software, hardware, or combinations of hardware and software. Although the present invention and its advantages have been described in detail, it should be understood that various changes, substitutions and alterations may be made herein without departing from the spirit and scope of the invention, as defined in the appended claims.

What is claimed is:

1. A multifunction data storage register, comprising:
   at least one first register cell having,
      a first input multiplexer for selecting between two input signals responsive to one or more control signals and having a first output signal,
      a first input logic circuit having a first input connected to said first output signal of said first input multiplexer and a second input connected to a cell output signal and having a third output signal,
      a first shift register latch having an input connected to said third output signal of said first input logic circuit and having a fourth output signal,
      a first output logic circuit having a first input connected to said fourth output signal of said first shift register latch and a second input connected to a feedback signal and having a fifth output signal, and
      a first output multiplexer for selecting between said fifth output signal and said fourth output signal responsive to said one or more control signals and having a first cell output signal, and
   at least one second register cell having,
      a second input multiplexer for selecting between two input signals responsive to said one or more control signals and having a seventh output signal,
      a second input logic circuit having a first input connected to said seventh output signal of said second input multiplexer and a second input connected to a cell output signal and having an eighth output signal, and
      a second shift register latch having an input connected to said eighth output signal of said second input logic circuit and having a second cell output signal.

2. The register of claim 1, wherein said at least one first register cell is three such cells and said at least one second register cell is thirteen such cells.

3. The register of claim 2, wherein said first register cells form bit positions zero, two and fifteen and said second register cells form the remaining bit positions.

4. The register of claim 3, wherein said output signals from said first and second input logic circuits are provided to a plurality of summing logic circuits.

5. The register of claim 3, wherein the output signal from said first shift register latch corresponding to bit position fifteen also provides said feedback signal.

6. The register of claim 1, wherein one of said two inputs to said input multiplexers is data from a data bus.

7. The register of claim 1, wherein one of said two inputs to said input multiplexers is inverted data addresses from a data address bus.

8. The register of claim 1, wherein said one or more control signals shift the register function between a parallel signature analysis mode and a breakpoint mode.

9. A multifunction register, comprising:
   a first register cell having,
      a first input multiplexer for selecting between two input signals responsive to one or more control signals and having a first output signal,
      a first input exclusive not OR circuit having a first input connected to said first output signal and a second input connected to a second output signal and having a third output signal,
      a first shift register latch having an input connected to said third output signal and having a fourth output signal,
      a first output exclusive not OR circuit having a first input connected to said fourth output signal and a second input connected to a feedback signal and having a fifth output signal, and
      a first output multiplexer for selecting between said fifth output signal and said fourth output signal responsive to said one or more control signals and having a sixth output signal,
   a second register cell having,
      a second input multiplexer for selecting between two input signals responsive to said one or more control signals and having a seventh output signal,
      a second input exclusive not OR circuit having a first input connected to said seventh output signal and a second input connected to a sixth output signal and having an eighth output signal, and
      a second shift register latch having an input connected to said eighth output signal and having a ninth output signal,
   a third register cell having,
      a third input multiplexer for selecting between two input signals responsive to one or more control signals and having a tenth output signal,
      a third input exclusive not OR circuit having a first input connected to said tenth output signal and a second input connected to said ninth output signal and having an eleventh output signal,
      a third shift regsiter latch having an input connected to said eleventh output signal and having a twelvfth output,
      a third output exclusive not OR circuit having a first input connected to said twelfth output signal and a second input connected to a feedback signal and having a thirteenth output signal, and
      a third out multiplexer for selecting between said twelfth output signal and said thirteenth output signal responsive to said one or more control signals and having a fourteenth output signal, a fourth register cell having,
  a fourth input multiplexer for selecting between two input signals responsive to said one or more control signals and having a fifteenth output signal,
  a fourth input exclusive not OR circuit having a first input connected to said fifteenth output signal and a second input connected to said fourteenth output signal and having an sixteenth output signal, and
  a fourth shift register latch having an input connected to said sixteenth output signal and having a second output signal.

10. A register cell for a multifunctional register, comprising:
  an input multiplexer for selecting between two input signals responsive to one or more control signals and having a first output signal,
  an input exclusive not OR circuit having a first input connected to said first output signal and a second input connected to a cell output signal and having a third output signal,
  a shift register latch having an input connected to said third output signal and having a fourth output signal,
  an output exclusive not OR circuit having a first input connected to said fourth output signal and a second input connected to a feedback signal and having a fifth output signal, and
  an output multiplexer for selecting between said fifth output signal and said fourth output signal responsive to said one or more control signals and having a cell out signal.

11. A register cell for a multifunctional register, comprising:
  an input multiplexer for selecting between two input signals responsive to one or more control signals and having a first output signal,
  an input exclusive not OR circuit having a first input connected to said first output signal and a second input connected to a cell output signal and having a second output signal, and
  a shift register latch having an input connected to said second output signal and having a cell output signal.

* * * * *